(12) United States Patent
Behrends et al.

(10) Patent No.: US 7,443,744 B2
(45) Date of Patent: Oct. 28, 2008

(54) METHOD FOR REDUCING WIRING AND REQUIRED NUMBER OF REDUNDANT ELEMENTS

(75) Inventors: Derick Gardner Behrends, Rochester, MN (US); Peter Thomas Freiburger, Rochester, MN (US); Ryan Charles Kivimagi, Chatfield, MN (US); Daniel Mark Nelson, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 89 days.

(21) Appl. No.: 11/559,431

(22) Filed: Nov. 14, 2006

(65) Prior Publication Data

US 2008/0112237 A1   May 15, 2008

(51) Int. Cl.
*G11C 7/00*   (2006.01)

(52) U.S. Cl. .................. 365/200; 365/63; 365/230.02
(58) Field of Classification Search ................ 365/200, 365/63, 230.03
See application file for complete search history.

(56) References Cited

U.S. PATENT DOCUMENTS

| | | | | |
|---|---|---|---|---|
| 6,571,348 | B1 * | 5/2003 | Tsai et al. | 714/6 |
| 6,885,596 | B2 * | 4/2005 | Asano et al. | 365/200 |

* cited by examiner

*Primary Examiner*—Son Dinh
(74) *Attorney, Agent, or Firm*—Joan Pennington

(57) ABSTRACT

A method and enhanced Static Random Access Memory (SRAM) redundancy circuit reduce wiring and the required number of redundant elements. A bitline redundancy mechanism allows the swapping of a pair of bitlines for a redundant pair of bit columns. Two of the adjacent bitlines are swapped out at a time, one even and one odd. The swap is accomplished by steering the data around the bad columns and adding redundant columns on the end that are steered in when needed.

4 Claims, 9 Drawing Sheets

PRIOR ART

METHOD FOR REDUCING WIRING AND REQUIRED NUMBER OF REDUNDANT ELEMENTS

FIELD OF THE INVENTION

The present invention relates generally to the data processing field, and more particularly, relates to a method and enhanced Static Random Access Memory (SRAM) redundancy circuit to reduce wiring and the required number of redundant elements.

DESCRIPTION OF THE RELATED ART

Referring to FIGS. 1, 2, and 3, a prior art SRAM redundancy arrangement is shown. This conventional SRAM redundancy arrangement can only swap out defective cells starting on an even column. This necessitated using four redundant columns labeled R in FIG. 1 to cover all required repairs, including repairs between any two columns.

As shown in FIG. 1, the prior art SRAM redundancy circuit includes a plurality of pairs of series connected 2:1 multiplexers (MUXs). Each pair of series connected MUXs is connected to an adjacent pair of odd and even SRAM columns. The first MUX of a pair of MUXs is a bit decode MUX, each of the first MUXs receiving a select bit (BS). In operation, all the first MUXs take input A, the even SRAM column; or all take input B, the odd SRAM column. With a BS=0, the A input is selected and BS=1, the B input is selected.

Redundancy steering is provided with the second MUX after the first bit decode MUX in the prior art arrangement. Replacements are provided only on even bits, and that in turn forces the need for 4 redundant elements. For example, as indicated by an X between columns 1 and 2 in FIG. 1, a shift of four bits are needed for any 2 bit replacement, as schematically illustrated above the columns 2, 3, 4, and 5.

FIG. 2 shows a prior art predecoder block that feeds the prior art SRAM redundancy decode circuits shown in FIG. 3. The prior art SRAM redundancy decode circuits as shown in FIG. 3 include 64 redundant decode circuits, one for each even SRAM column in a SRAM design with 128 columns. A standard 2 to 4 address predecoder illustrated in FIG. 2 is used to generate the inputs to the first stage of the redundant decode circuit. A redundant enable (RED-EN) is applied to a buffer that provides a redundancy decode signal RED_BL_MASTER. In each of the 64 bit decode circuits, a steering input STEER_T_MINUS_1 is applied to an inverter 302. The predecoded bits labeled GROUP 01, GROUP 23, GROUP 45 are applied to a 3-input NAND 304. The output of inverter 302 and NAND 304 are applied to a NAND 306. The output of NAND 306 and the redundancy decode signal RED_BL_MASTER is applied to a NAND 308. NAND 308 generates a STEER_C signal that is inverted by an inverter 310 generating a STEER_T signal. In operation, the redundancy address decodes to the first column to be shifted or steered. Then each stage feeds the results of its decode to the next decoders 300, #0-63, such that once the decoded one is found it forces all subsequent decodes to be true. Every column after that one is then shifted and at the end the redundant elements are steered in.

In addition to requiring four redundant columns to cover all required repairs the prior art arrangement, another disadvantage is that the redundancy decode signal RED_BL_MASTER requires a respective separate wire for connection to each of the decoders 300, #0-63.

SUMMARY OF THE INVENTION

Principal aspects of the present invention are to provide a method and enhanced Static Random Access Memory (SRAM) redundancy circuit to reduce wiring and the required number of redundant elements. Other important aspects of the present invention are to provide such method and enhanced Static Random Access Memory (SRAM) redundancy circuit to reduce wiring and the required number of redundant elements substantially without negative effect and that overcome some of the disadvantages of prior art arrangements.

In brief, a method and enhanced Static Random Access Memory (SRAM) redundancy circuit are provided to reduce wiring and the required number of redundant elements. A bitline redundancy mechanism allows the swapping of a pair of bitlines for a redundant pair. The bit columns are interleaved with respective even and odd bits, two of the adjacent bits are swapped out at a time, one even and one odd. The swap is accomplished by steering the data around the bad columns and adding redundant columns on the end that are steered in when needed.

In accordance with features of the invention, only two redundant columns are required to replace a defect that includes two bad columns. With a SRAM including 128 columns, 128 redundant decode circuits are used. An embedded redundant enable is applied to an input each of the 128 redundant decode circuits and thereby an additional wire advantageously is saved by embedding the redundancy enable as compared to prior art arrangements.

In accordance with features of the invention, a single multiplexer (MUX) provides redundancy steering incorporated with bit decode. A bit select (BS) and a redundancy steer select (RS<0:1>) are combined to provide steering around a bad column and adding redundant columns in the SRAM redundancy circuit.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In accordance with features of the invention, a method and enhanced Static Random Access Memory (SRAM) redundancy circuit are provided to reduce wiring and the required number of redundant elements. A bitline redundancy mechanism allows the swapping of a pair of bitlines for a good set. By enabling the decode to occur at any column, all required repairs may be made with only two redundant columns. The bit columns are interleaved with even and odd bits; two of the adjacent bits are swapped out at a time, one even and one odd.

The swap is accomplished by steering the data around the bad columns and adding redundant columns on the end that are steered in when needed. A single multiplexer (MUX) provides redundancy steering incorporated with bit decode. In the redundancy steering bit decode of the invention, it is guaranteed that once steering is started, all bits thereafter are steered as required.

In accordance with features of the invention, only two redundant columns are required to replace a defect including two defective columns. Assuming a SRAM design with 128 columns, the prior art requires 64 redundant decode circuits, one for each even column. The invention has higher granularity, using 128 redundant decode circuits. Both the prior art and the invention use standard 2 to 4 address predecoders to generate the inputs to the first stage of the redundant decode circuit. The redundant address decodes to the first column to be shifted or steered. Every column after that one is then shifted and at the end the redundant elements are steered in.

Figure 1:
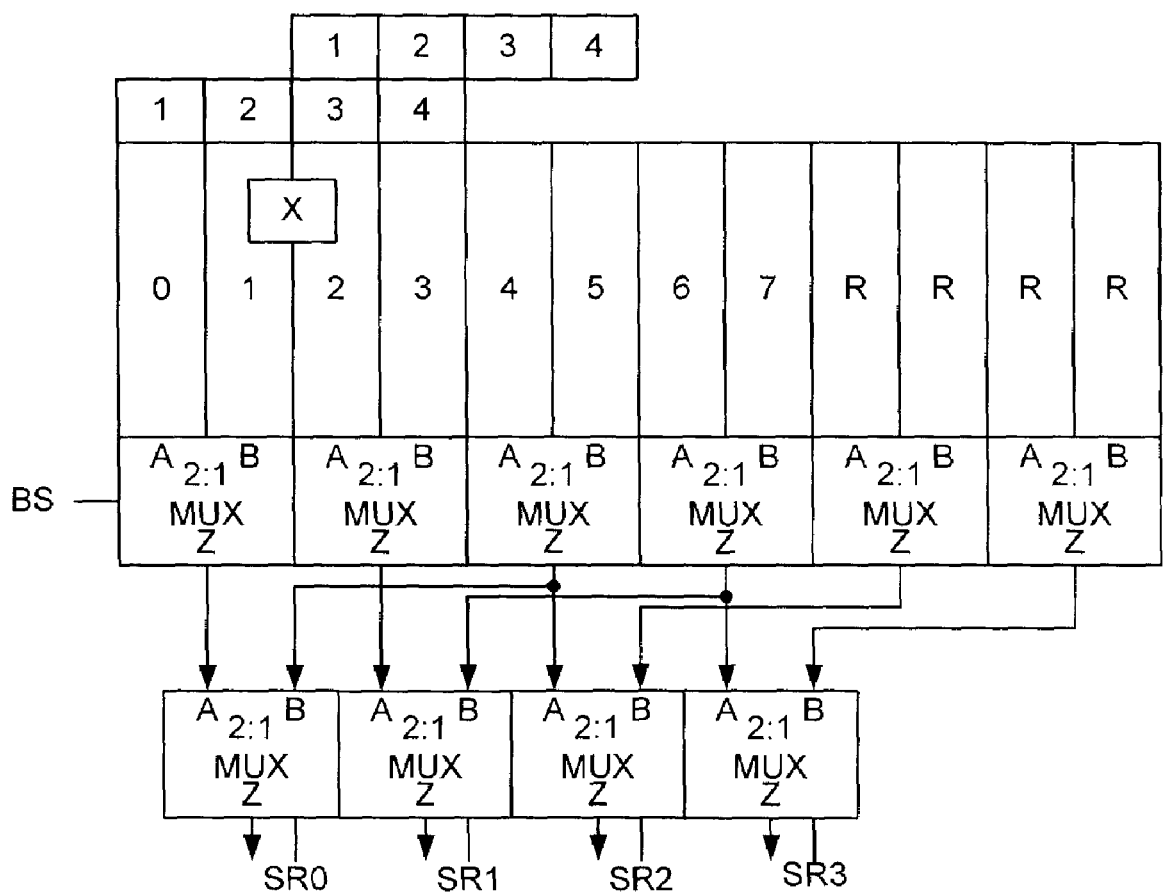
FIGS. 1, 2, and 3 illustrates a prior art SRAM redundancy arrangement.
Figure 2:
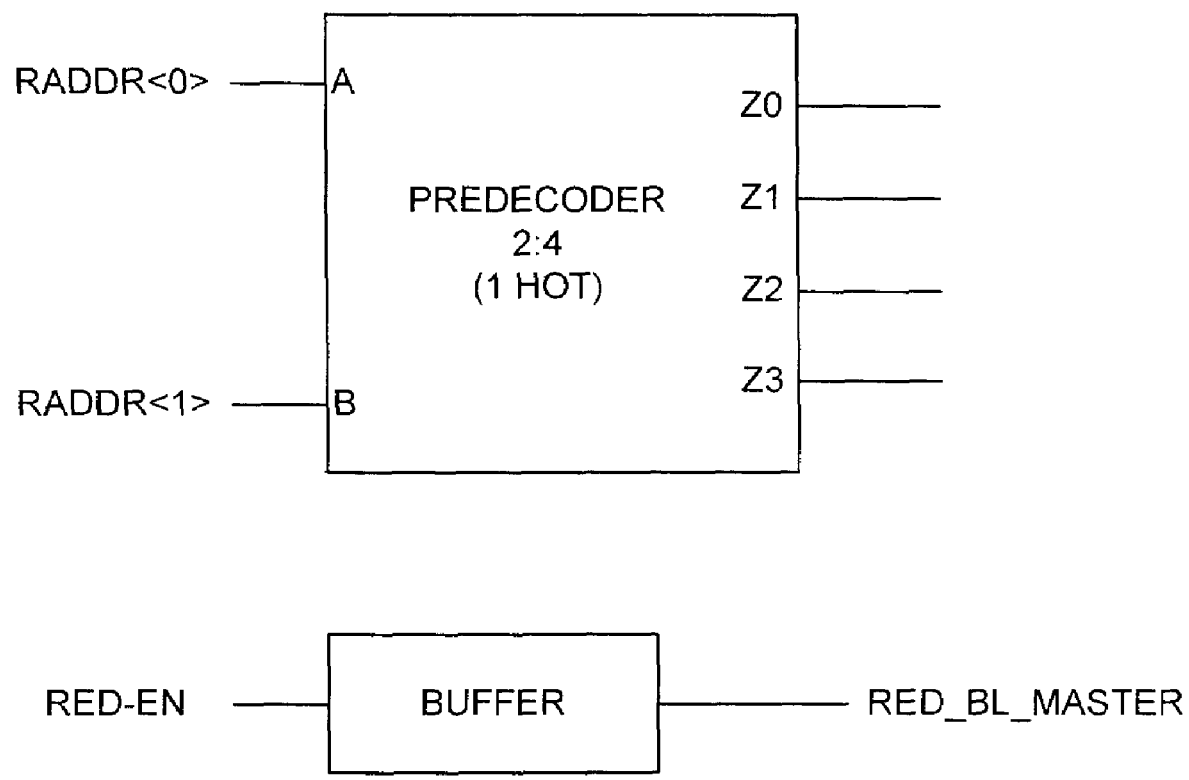
Figure 4:
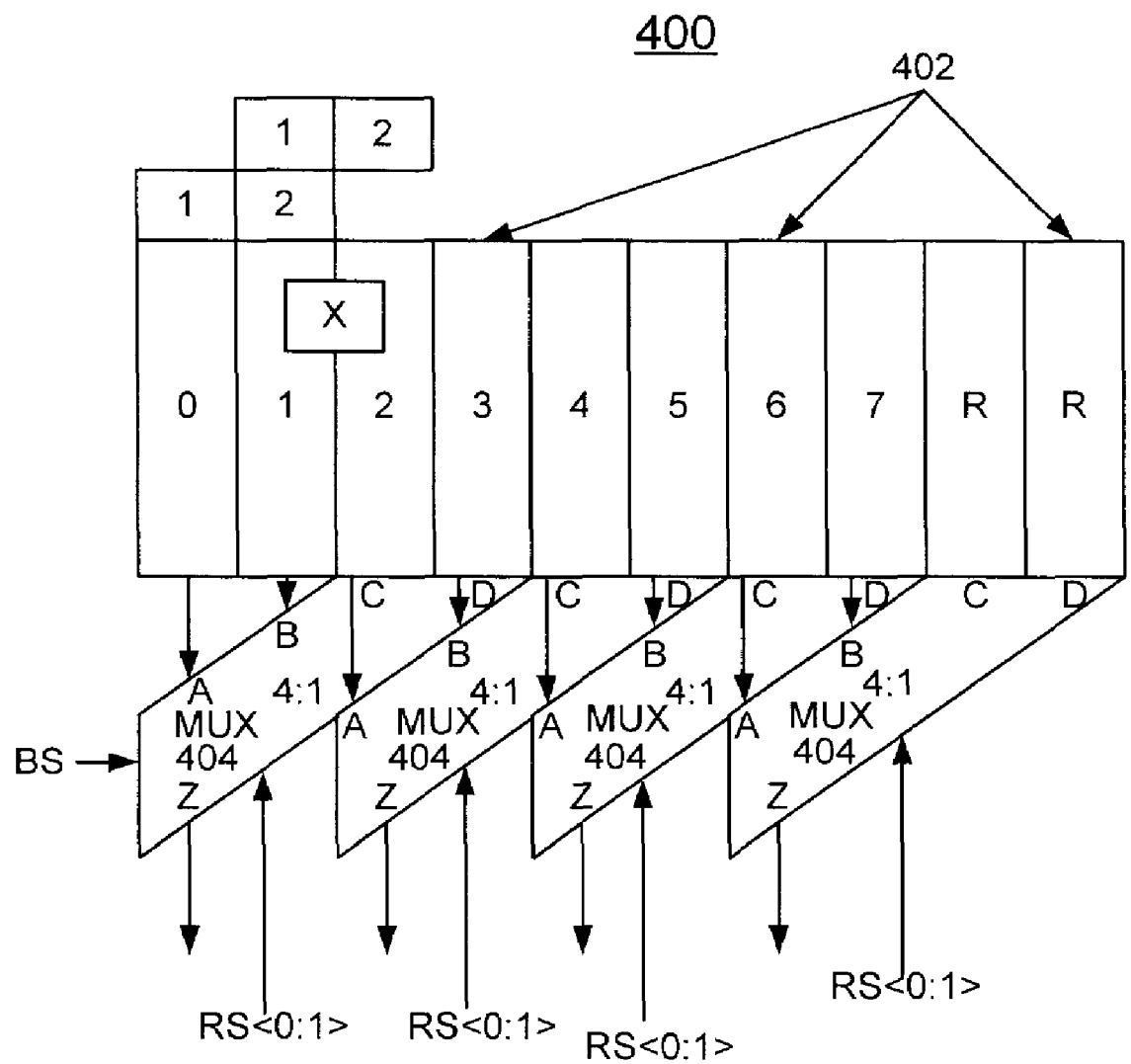
FIG. 4 illustrates an exemplary SRAM redundancy circuit in accordance with the preferred embodiment.

Having reference now to the drawings, in FIG. 4, there is shown an exemplary SRAM redundancy circuit generally designated by the reference character 400 in accordance with the preferred embodiment. SRAM redundancy circuit 400 includes a plurality of SRAM columns 402 including a pair of redundancy SRAM columns labeled R. A single 4:1 multiplexer (MUX) 404 provides redundancy steering incorporated into a bit decode. Each MUX 404 is used instead of the two 2:1 MUXs in series of the prior art arrangement of FIG. 1.

Each MUX 404 receives a select bit (BS) and the redundancy select RS<0:1>. Each column 402 is fed into two of the 4:1 MUXs, with the exception of the first two columns 0, 1. The output from column 0, 402 goes to A of the first MUX 404, column 1 goes to B of the first MUX 404, column 2 goes to C of first MUX 404 and to A of the second MUX 404, column 3 goes to D of first MUX 404 and B of second MUX 404, and the like. Note that each 4:1 MUX 404 has 3 selector inputs (BS, RS<0> and RS<1>). BS is the same select bit as in prior art as shown FIG. 1. RS<0:1> are steering selects provided by the decoder circuits illustrated in FIG. 6. For example, as indicated by an X between columns 1 and 2 in FIG. 4, a shift of two bits are needed for any 2 bit replacement, as schematically illustrated above the columns 1 and 2.

Figure 5A:
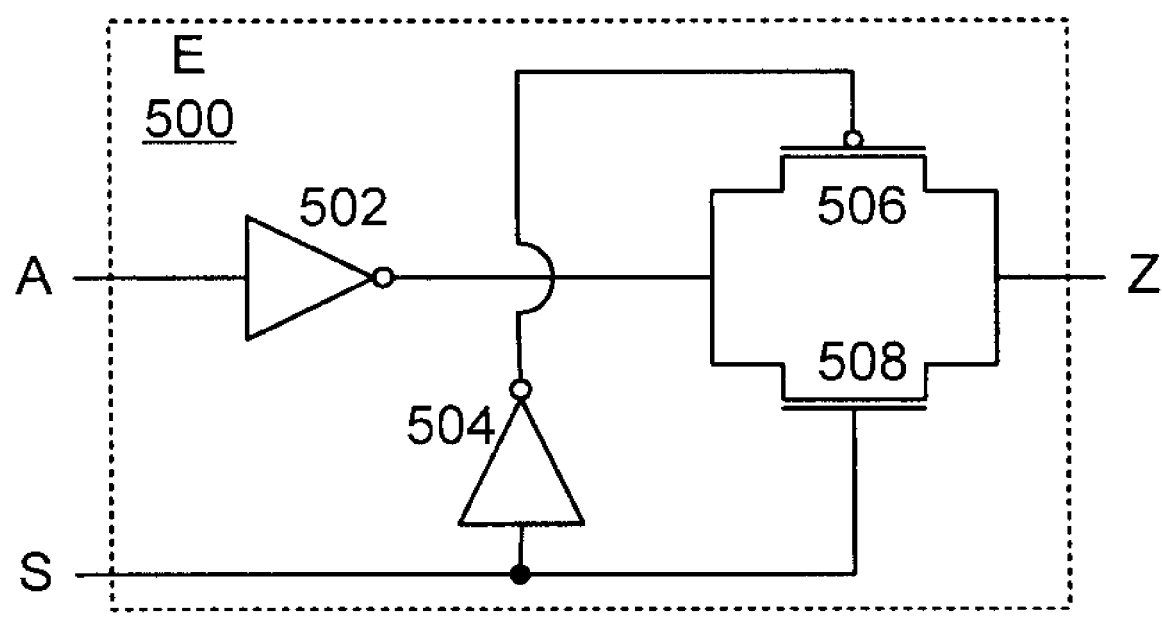
FIGS. 5A and 5B together illustrate an exemplary 4:1 multiplexer (MUX) of the SRAM redundancy circuit of FIG. 4 in accordance with the preferred embodiment.
Figure 5B:
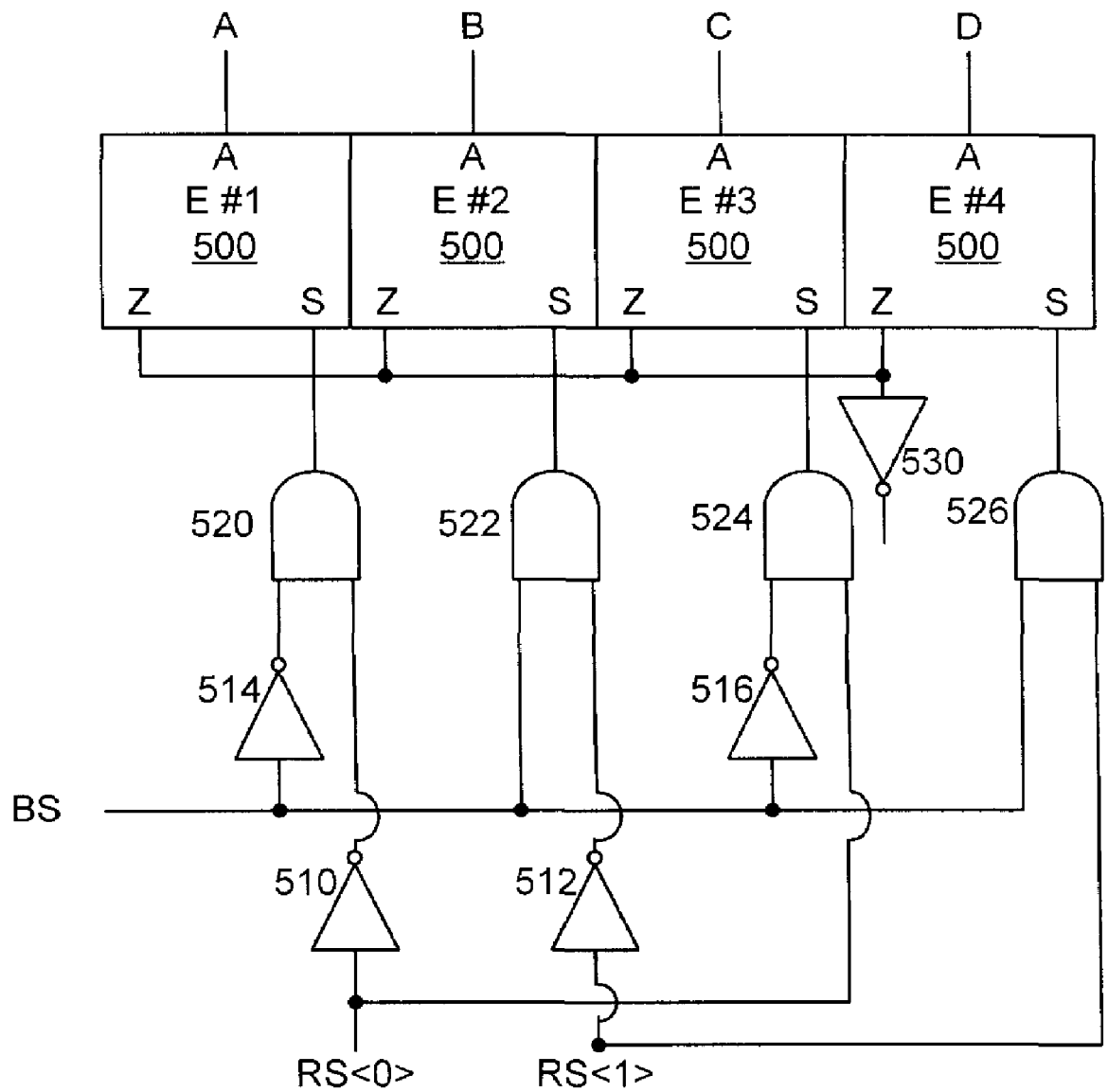

FIGS. 5A and 5B together illustrate an exemplary 4:1 multiplexer (MUX) 404 of the SRAM redundancy circuit 400 of FIG. 4 in accordance with the preferred embodiment.

Referring now to FIG. 5A, an element E, 500 is shown that is used to construct the 4:1 MUX 404. Element E, 500 includes a first inverter 502 receiving an A input, and a second inverter 504 receiving an input S. Element E, 500 includes a parallel-connected P-channel field effect transistor (PFET) 506 and N-channel field effect transistor (NFET) 508 providing an output Z. Second inverter 504 provides a gate input to PFET 506 and input S connects to a gate input of NFET 508.

Referring also to FIG. 5B, 4:1 MUX 404 includes a plurality of elements E #1-4, 500 receiving a respective input A, B, C, D and the input S. Selector inputs BS, RS<0> and RS<1> are applied via logic function defined by a plurality of invertors 510, 512, 514, 516, and a plurality of AND gates 520, 522, 524, 526. Input BS is applied to AND gates 522, 526, and is inverted and applied to AND gates 520, 524. The redundancy select RS<0> is applied to AND gate 524 and is inverted and applied to AND gate 520. The redundancy select RS<1> is applied to AND gate 526 and is inverted and applied to AND gate 522. A respective output S of AND gates 520, 522, 524, 526 is applied to the input S of elements E #1-4, 500. An output Z of respective elements E #1-4, 500 is applied to an inverter 530, providing anon-inverted output of the 4:1 MUX 404.

In accordance with features of the invention, the bit select (BS) and the redundancy steer select (RS<0:1>) are combined to properly select the correct bit. Essentially, when a steering bit is present, the MUX 404 takes the bit from two columns over and starts steering with every bit thereafter being steered, and two columns are never steered into the same MUX output. SRAM redundancy circuit 400 with MUX 404 provides a significant change from the prior art SRAM redundancy circuit of FIG. 1, which caused a shift of 4 bits for any 2 bit replacement.

Figure 6:
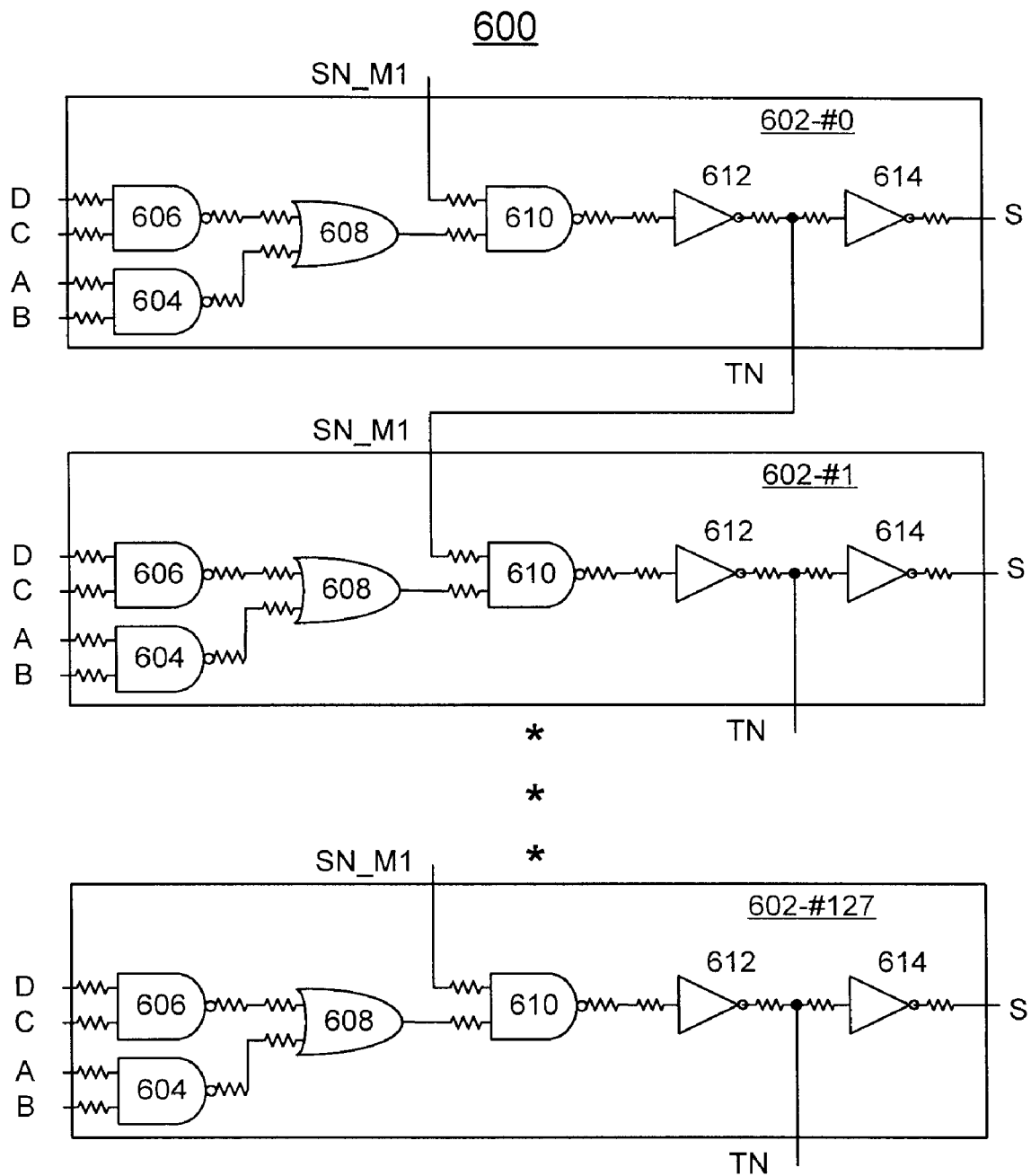
FIG. 6 illustrates exemplary SRAM redundancy decode circuits in accordance with the preferred embodiment.

Referring now to FIG. 6, there is shown an exemplary SRAM redundancy decode generally designated by the reference character 600 in accordance with the preferred embodiment. SRAM redundancy decode 600 includes 128 redundant decode circuits 602, #0-127. SRAM redundancy decode 600 includes one redundant decode circuits 602 for each even and odd SRAM column in a SRAM design with 128 columns. A standard 2 to 4 address predecoder illustrated in FIGS. 7A and 7B is used to generate the inputs to the redundant decode circuits 602.

Figure 3:
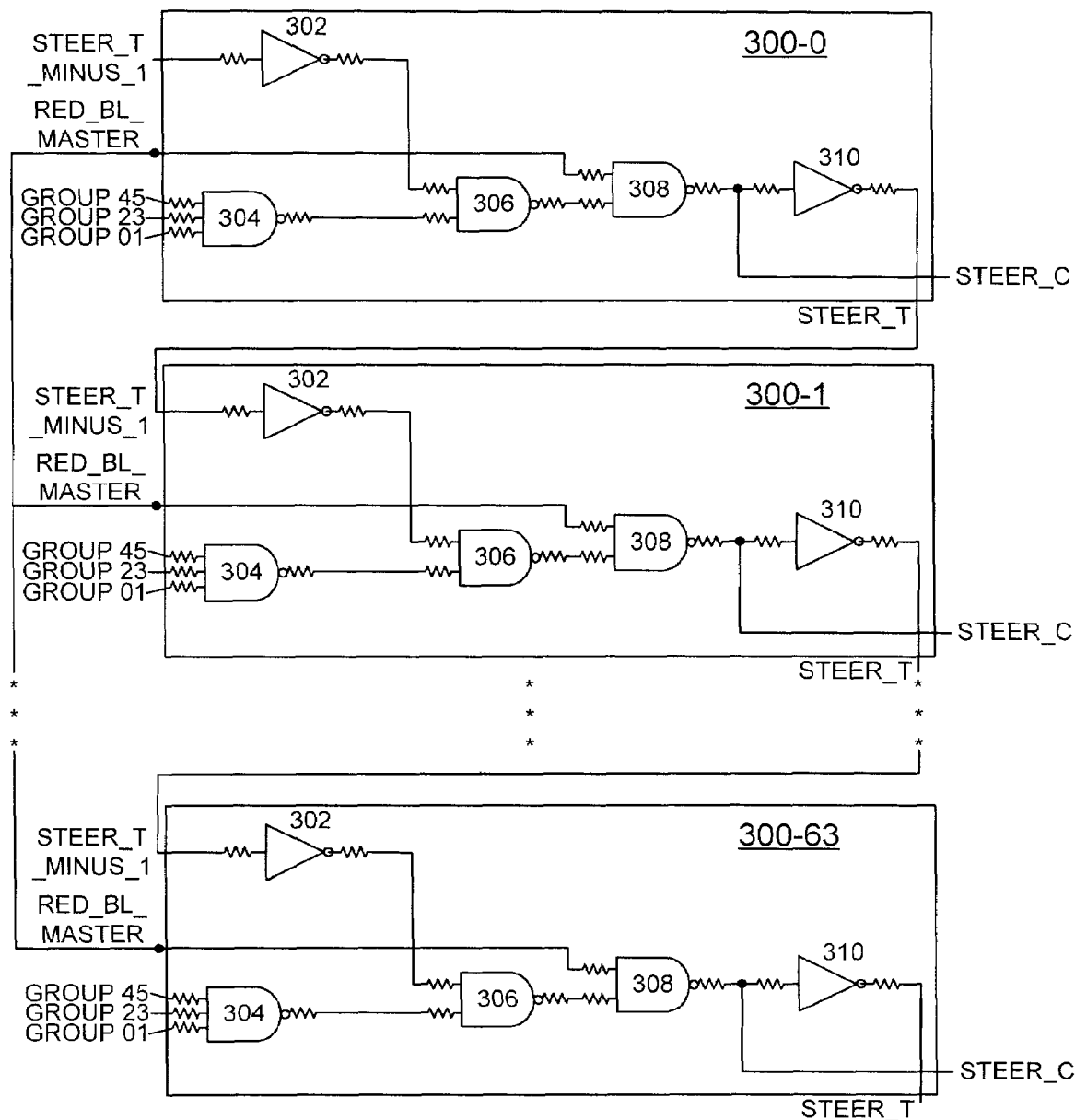

An embedded redundant enable is applied to an input each of the 128 redundant decode circuits 602. An additional wire advantageously is saved by embedding the redundancy enable into the decode 602, as compared to the prior art decode circuits illustrated in FIG. 3.

Each of the 128 redundant decode circuits 602, #0-127 includes a pair of NAND gates 604, 606 respectively receiving inputs A, B and C, D and having a respective output applied to an OR gate 608. The output of OR gate 608 and a decode signal SN_M1 is applied to a NAND 610. NAND 610 generates a signal that is sequentially inverted by a pair of series connected inverters 612, 614 to generate an output S signal. The redundant address decodes to the first column to be shifted or steered. Then each stage 602, #0-127 feeds the results SN_M1 of its decode at node TN at the output of the first inverter 612 to the next respective one of the decoders 602, #0-127.

Figure 7A:
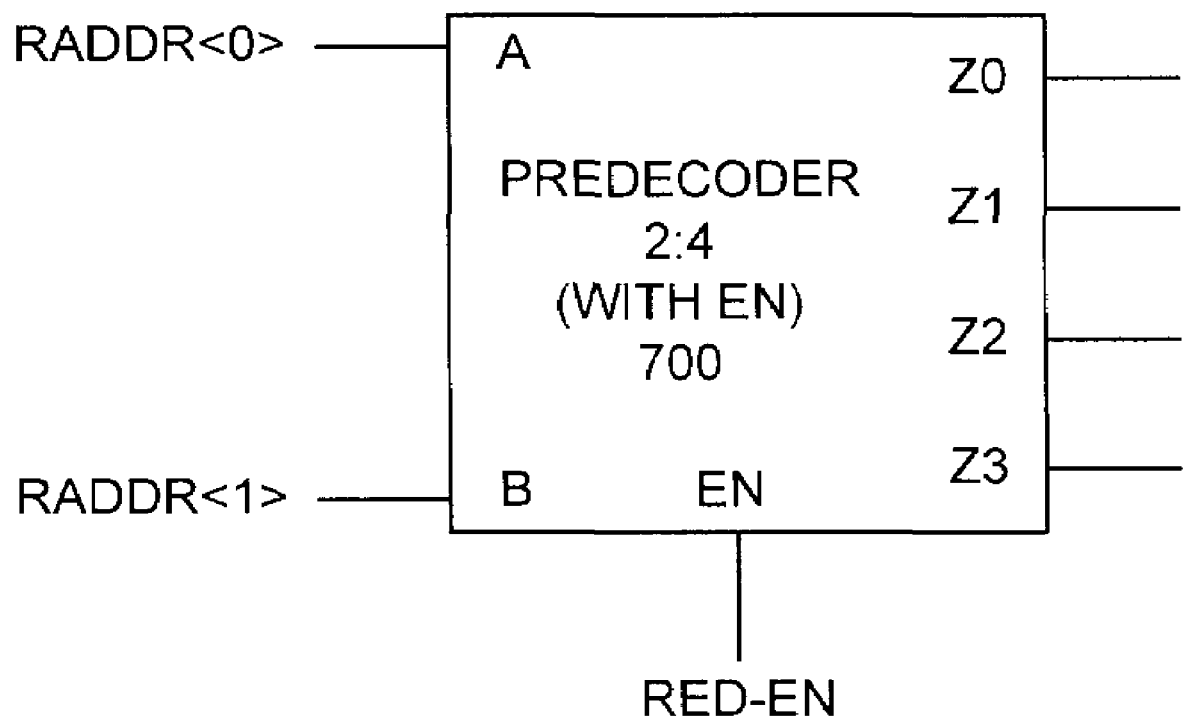
FIGS. 7A and 7B together illustrate an exemplary 2:4 predecoder used with the SRAM redundancy decode circuits of FIG. 6 in accordance with the preferred embodiment.
Figure 7B:
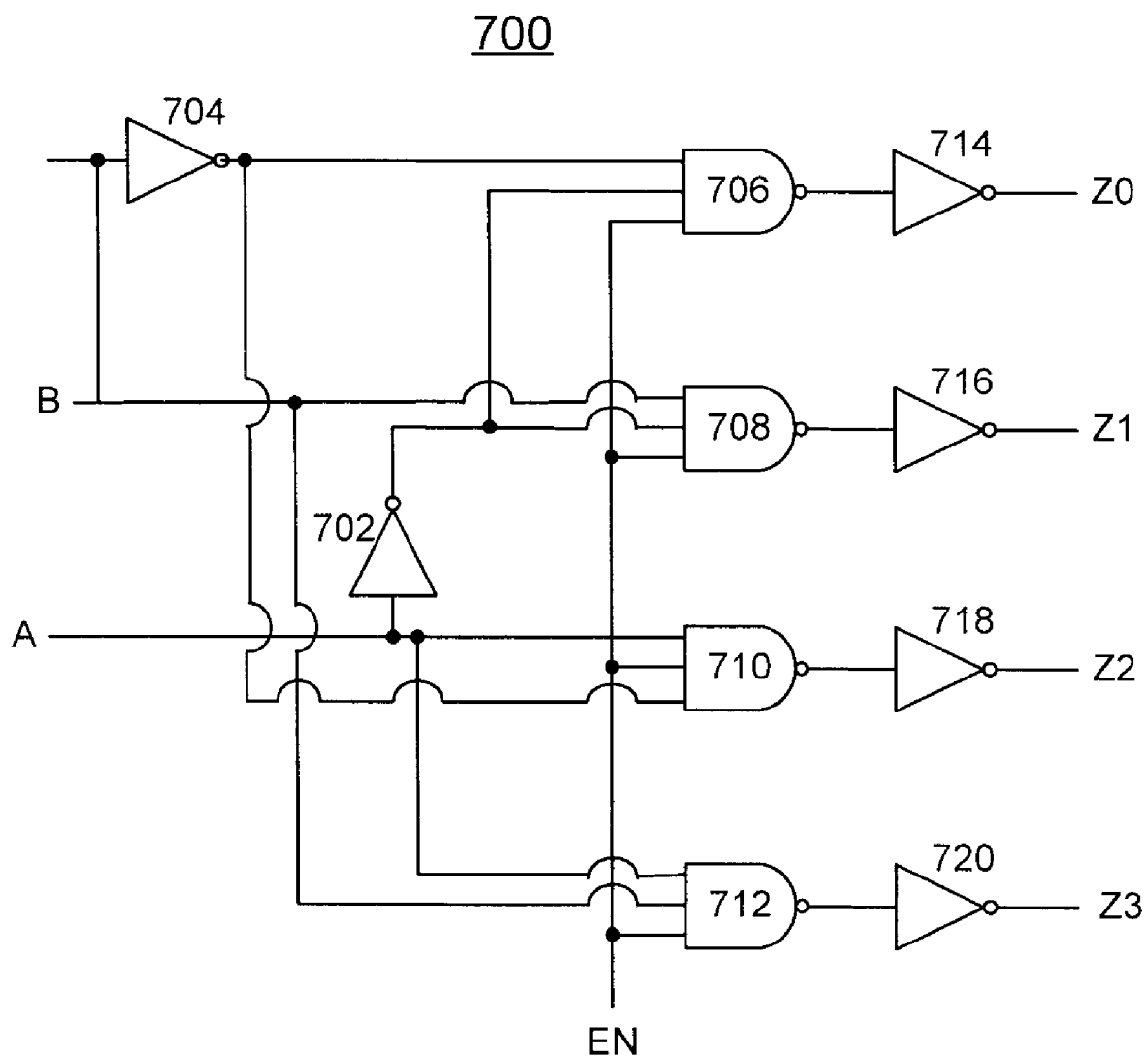

FIGS. 7A and 7B together illustrate an exemplary 2:4 predecoder generally designated by the reference character 700 for use with the SRAM redundancy decode 600 of FIG. 6 in accordance with the preferred embodiment. The 2:4 predecoder 700 receives a redundant enable signal RED-ED applied to an enable input EN.

Referring now to FIG. 7B, the 2:4 predecoder 700 includes a pair of inverters 702, 704 respectively receiving the A input and the B input. The outputs of inverters 702, 704 and the A input and the B input are applied to respective inputs of a plurality of 3-input NAND gates 706, 708, 710, 712, as shown. The redundant enable input EN is applied to an input of each of 3-input NAND gates 706, 708, 710, 712. The respective output of each of 3-input NAND gates 706, 708, 710, 712 is applied to a respective one of a plurality of inverters 714, 716, 718, 720 providing outputs Z0, Z1, Z2, Z3.

While the present invention has been described with reference to the details of the embodiments of the invention shown in the drawing, these details are not intended to limit the scope of the invention as claimed in the appended claims.

What is claimed is:

1. A method for implementing a Static Random Access Memory (SRAM) redundancy circuit with bit columns interleaved with respective even and odd bits comprising:
providing a bitline redundancy mechanism to allow swapping of a pair of bitlines for a redundant bitline pair;
swapping two of the adjacent bitlines at a time, one even and one odd by steering around at least one bad column and adding two redundant columns.

2. The method for implementing a SRAM circuit as recited in claim 1 includes providing a multiplexer for providing redundancy steering incorporated with a bit decode.

3. the method for implementing a SRAM circuit as recited in claim 2 includes combining a bit select (BS) and a redundancy steer select (RS<0:1>) to provide select input to said multiplexer.

4. The method for implementing a SRAM circuit as recited in claim 2 includes applying an embedded redundant enable to an input of a redundancy decode circuit.

* * * * *